(12) United States Patent
Cho

(10) Patent No.: US 6,611,016 B2
(45) Date of Patent: Aug. 26, 2003

(54) CAPACITOR FOR SEMICONDUCTOR DEVICE AND METHOD FOR MANUFACTURING THE SAME

(75) Inventor: Won Cheol Cho, Seoul (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 0 days.

(21) Appl. No.: 10/186,673

(22) Filed: Jul. 2, 2002

(65) Prior Publication Data

US 2002/0167040 A1 Nov. 14, 2002

Related U.S. Application Data

(62) Division of application No. 08/965,486, filed on Nov. 6, 1997.

(30) Foreign Application Priority Data

Nov. 27, 1996 (KR) .............................................. 96-58097

(51) Int. Cl.[7] ........................ H01L 29/76; H01L 27/08; H01L 29/94; H01L 31/119
(52) U.S. Cl. ........................ 257/303; 257/307; 257/308
(58) Field of Search ................................ 257/296, 303, 257/304, 306, 307, 308, 309, 310; 438/253, 254, 396, 397

(56) References Cited

U.S. PATENT DOCUMENTS

| | | |
|---|---|---|
| 5,137,842 A | 8/1992 | Chan et al. |
| 5,164,337 A | 11/1992 | Ogawa et al. |
| 5,443,993 A | 8/1995 | Park et al. |
| 5,491,103 A | 2/1996 | Ahn et al. |
| 5,620,918 A * | 4/1997 | Kondoh ........................ 438/396 |
| 5,688,726 A | 11/1997 | Kim |
| 5,712,202 A * | 1/1998 | Liaw et al. ................... 438/253 |
| 5,763,305 A | 6/1998 | Chao |
| 5,837,578 A | 11/1998 | Fan et al. |
| 5,854,105 A | 12/1998 | Tseng |

* cited by examiner

*Primary Examiner*—Wael Fabmy
*Assistant Examiner*—Ginette Peralta
(74) *Attorney, Agent, or Firm*—Birch, Stewart, Kolasch & Birch, LLP.

(57) ABSTRACT

A capacitor for a semiconductor device is disclosed with increased capacitance which is produced by a simplified manufacturing process. The capacitor has a storage node electrode structure formed on the semiconductor device having impurity regions formed therein. The storage node electrode structure includes a buried layer formed in a storage node hole defined by the semiconductor device, the buried layer being in contact with at least one impurity region, a bottom layer formed on the buried layer and extending beyond the buried layer, a first cylindrical electrode having first walls upwardly extending from the bottom layer, and second cylindrical electrodes having second walls upwardly extending from the bottom layer and disposed on outer sides of the first cylindrical electrode.

8 Claims, 7 Drawing Sheets

F I G.3a
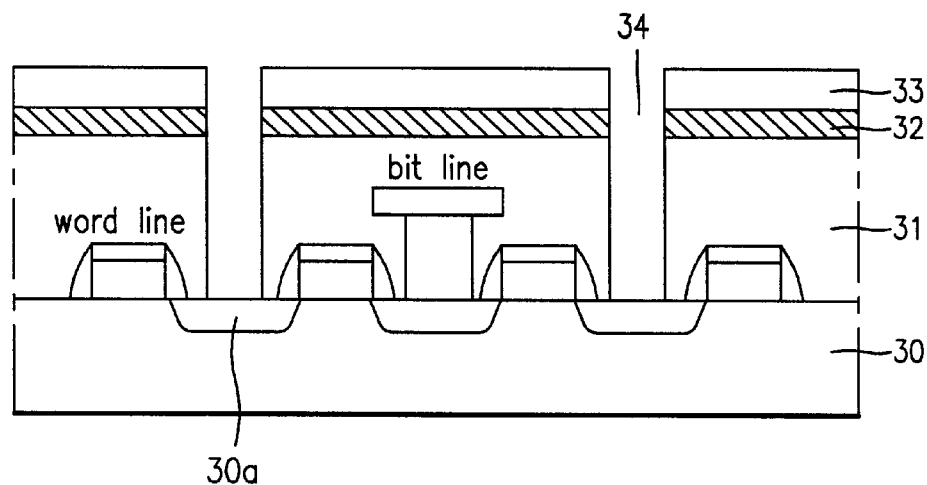
F I G.3b
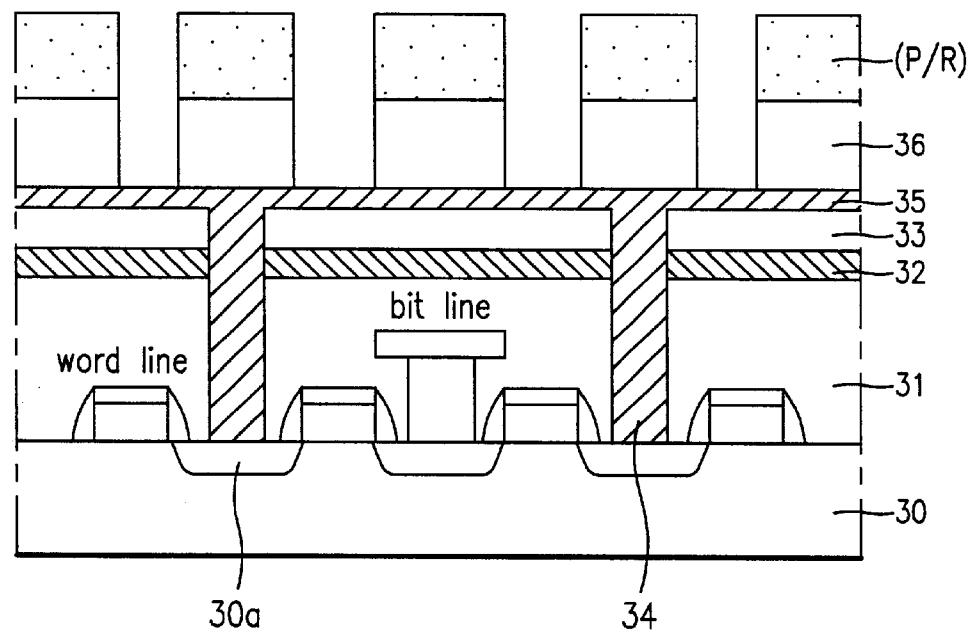

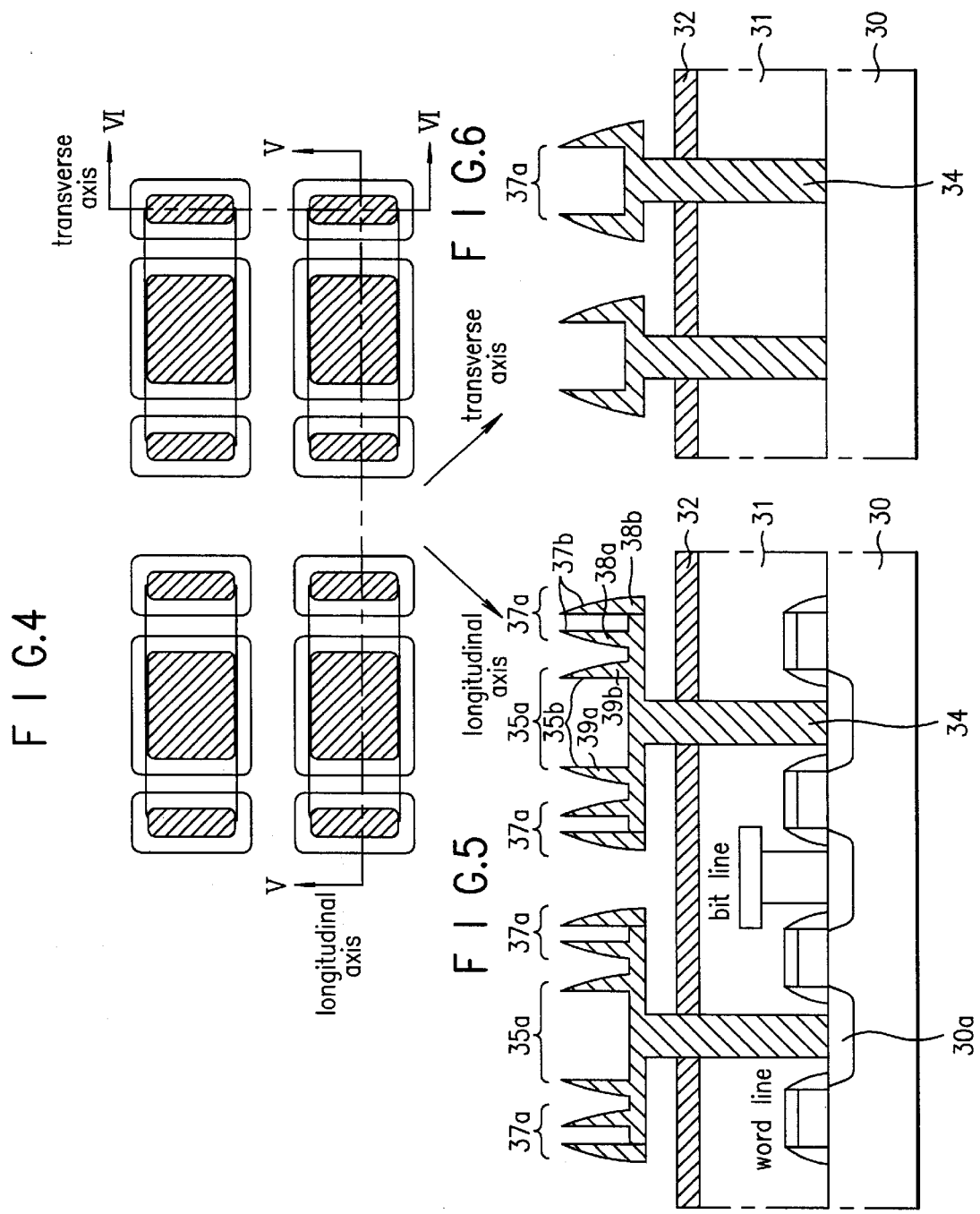

CAPACITOR FOR SEMICONDUCTOR DEVICE AND METHOD FOR MANUFACTURING THE SAME

This application is a divisional of co-pending application Ser. No. 08/965,486, filed on Nov. 6, 1997, the entire contents of which are hereby incorporated by reference and for which priority is claimed under 35 U.S.C. §120; and this application claims priority of Application No. 58097/1996 filed in Korea on Nov. 27, 1996 under 35 U.S.C. §119.

BACKGROUND OF THE INVENTION

1. Field of the Invention

The present invention relates to a capacitor for a semiconductor device and, more particularly, to a capacitor for a Dynamic Random Access Memory (DRAM) type semiconductor memory device that is able to effectively increase its capacitance and simplify its manufacturing process.

2. Discussion of the Related Art

There are generally two kinds of capacitor types for a semiconductor device: a stacked capacitor type and a trench capacitor type. The stacked capacitor type is divided into, e.g., a fin type structure, a cylindrical type structure, a box type structure, and other type structures.

A stacked capacitor type having a cylindrical type structure has a storage node electrode forming a cylindrical structure. In order to obtain sufficient cell capacitance, the cylindrical structure has been known to be most suitable for a semiconductor memory device having a 64 Mb or higher memory capacity.

Depending on the number of cylindrical structures and their types, a capacitor of a cylindrical type structure is divided into, e.g., a 1.0 cylinder-type capacitor, a 1.5 cylinder-type capacitor, a 2.0 cylinder-type capacitor, and a higher number cylinder-type capacitor.

Such cylinder-type capacitors have the following disadvantages.

First, a 1.0 cylinder-type capacitor has only one cylinder, which places restrictions on having an increased surface area. This is disadvantageous in providing accumulative capacitance for a cylinder-type capacitor. Second, in the case of a 2.0 cylinder-type capacitor, two cylinders are used, requiring more processing steps. This reduces high production yield and complicates the overall manufacturing process. Third, in the case of a 1.5 cylinder-type capacitor, it is difficult to control a profile of the cylinder-type capacitor using an etching process.

A conventional method for manufacturing a capacitor for a semiconductor device will be described with reference to the accompanying drawings.

Referring to FIGS. 1a through 1d, a conventional method for manufacturing a capacitor for a semiconductor device is illustrated.

First, an insulating material, e.g., an oxide layer, is deposited on a silicon substrate 10 having impurity diffusion regions (not shown) formed therein and cell transistors (not shown) formed thereon, thereby forming a first insulating layer 11, as shown in FIG. 1a. Next, a silicon nitride layer 12 is formed on the first insulating layer 11, and subsequently a photoresist layer (P/R) is deposited and patterned on the silicon nitride layer 12. With the patterned photoresist layer (P/R), which serves as a mask, the silicon nitride layer 12 and the first insulating layer 11 thereunder are selectively removed to form storage node contact holes 13.

As illustrated in FIG. 1b, a first polysilicon layer, which forms first storage node electrodes 14, is formed in the storage node contact holes 13 and on portions of the silicon nitride layer 12. An oxide layer is deposited on the first polysilicon layer by a chemical vapor deposition (CVD) method, so as to form a second insulating layer 15. Then, a photoresist (P/R') layer is deposited and patterned on the second insulating layer 15. With the photoresist pattern serving as a mask, the second insulating layer 15 and the first polysilicon layer are selectively removed, thereby forming the first storage node electrodes 14.

Subsequently, as shown in FIG. 1c, a second polysilicon layer, which forms second storage node electrodes 16, is formed on the remaining second insulating layer 15 and on portions of the silicon nitride layer 12. Then, the second polysilicon layer is subjected to etch back to form the second storage node electrodes 16 on the sides of the second insulating layer 15.

Referring to FIG. 1d, the second insulating layer 15, which is surrounded by the first and second storage node electrodes 14 and 16, is removed using a wet-etching process, thereby forming the first and second storage node electrodes 14 and 16 of a capacitor. Even though not shown in the figures, in the following step, a dielectric layer and an upper electrode are deposited on the upper portions of the first and second storage node electrodes 14 and 16, thereby completing the capacitor (having a 1.0 cylindrical type structure).

Referring to FIGS. 2a through 2f, another conventional method for manufacturing a capacitor of a semiconductor device is illustrated.

First, as shown in FIG. 2a, an insulating material, e.g. an oxide layer, is deposited on a silicon substrate 17 having impurity diffusion regions (not shown) formed therein and cell transistors (not shown) formed thereon, thereby forming a first insulating layer 18. Next, a photoresist layer (not shown) is deposited and patterned on the first insulating layer 18.

Then, using the patterned photoresist layer as a mask, the first insulating layer 18 is selectively removed to form a storage node contact hole 24. Thereafter, a first polysilicon layer 19 is formed on the entire surface of the first insulating layer 18 to a thickness that fills the storage node contact hole 24. An oxide layer is deposited on the first polysilicon layer 19 by using a CVD method, so as to form a second insulating layer 20.

Subsequently, a photoresist layer (P/R) is deposited and patterned on the entire surface of the second insulating layer 20. With the patterned photoresist layer, which serves as a mask, the second insulating layer 20 is selectively removed.

Referring to FIG. 2b, a second polysilicon layer 21 is formed on the entire surface of the first polysilicon layer 19 inclusive of the second insulating layer 20.

Referring to FIG. 2c, a third insulating layer 22 is formed on the second polysilicon layer 21.

Referring to FIG. 2d, insulating sidewalls 23 are formed on the sides of the second polysilicon layer 21 by subjecting the third insulating layer 22 to etch back. Thus, portions of the third insulating layer 22 become the insulating sidewalls 23.

Referring to FIG. 2e, using the second insulating layer 20 and the insulating sidewalls 23 as masks, the first and second polysilicon layers 19 and 21 are selectively etched. At this time, since the first polysilicon layer 19 is thicker than the second polysilicon layer 21, as shown in FIGS. 2b and 2c, during the etching process the second polysilicon layer 21 on the second insulating layer 20 is etched to expose the second insulating layer 20. Also, the first polysilicon layer 19 not corresponding to the second insulating layer 20 and insulating sidewalls 23 is selectively removed to have a predetermined thickness.

Finally, as seen in FIG. 2f, the remaining second insulating layer 20 and the insulating sidewalls 23 are completely removed, thus forming a storage node electrode of a capacitor (having a 1.5 cylinder-type structure with a protruding part in a center portion).

Even though not shown in the figures, in the following processing step, a dielectric layer and an upper electrode are deposited on the storage node electrode, thereby completing the capacitor.

In a conventional method for manufacturing a capacitor for a semiconductor device, capacitance is increased by increasing the height of the cylinder pillar of a cylindrical structure, which increases the surface area of the lower electrode. This is accomplished by increasing the height of an oxide layer and the height of a polysilicon layer. But this method is limited because of disadvantages in planarization.

Further, variation in the forms of cylinders may be one method for increasing capacitance. However, this method is difficult in obtaining the process tolerance for keeping up with the higher integration trend. This results in a low efficiency.

SUMMARY OF THE INVENTION

Accordingly, the present invention is directed to a capacitor for a semiconductor device that effectively increases capacitance and simplifies its manufacturing process for substantially obviating one or more problems due to limitations and disadvantages of the related art.

An object of the invention is to provide a capacitor for a semiconductor device which is advantageous in obtaining manufacturing process tolerance and planarization for the device and effectively increasing its capacitance.

To achieve these and other advantages and in accordance with the purposes of the present invention, as embodied and broadly described, the capacitor for a DRAM type semiconductor device includes a storage node electrode structure for a capacitor of a semiconductor device having impurity regions formed therein, including a buried layer disposed in a hole of the semiconductor device, the buried layer being in contact with at least one impurity region; a bottom layer formed on the buried layer and extending beyond the buried layer; a first cylindrical electrode having first walls upwardly extending from the bottom layer; and second cylindrical electrodes having second walls upwardly extending from the bottom layer and disposed on outer sides of the first cylindrical electrode Furthermore, the present invention is directed to a semiconductor device having a capacitor formed therein, including a substrate having impurity regions formed therein; an insulating layer disposed on the substrate; a buried layer disposed in a storage node area defined by at least the insulating layer, wherein the buried layer is in contact with at least one of the impurity regions; a bottom layer formed on the buried layer and extending beyond the buried layer; a first cylindrical electrode having first walls upwardly extending from the bottom layer; second cylindrical electrodes having second walls upwardly extending from the bottom layer and disposed on outer sides of the first cylindrical electrode; a dielectric layer disposed on the first cylindrical electrode and the second cylindrical electrodes; and an upper electrode disposed on the dielectric layer.

Moreover, the present invention is directed to a method for manufacturing a capacitor, including the steps of forming a hole in an insulating layer formed on a substrate to expose an impurity region; forming a first conductive layer on the insulating layer; forming an insulating layer pattern on the first conductive layer and selectively removing the insulating layer pattern and first conductive layer; forming a second conductive layer on the first conductive layer; removing anisotropically portions of the second conductive layer; removing the insulating layer pattern; forming a dielectric layer on the second conductive layer; and forming a third conductive layer on the dielectric layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3a through 3e are cross-sectional views showing a method for manufacturing a capacitor of a semiconductor device according to the embodiments of the invention;

FIG. 4 is a plan view of the semiconductor device having three capacitor structures per storage node along the longitudinal axis and one capacitor structure per storage node along the transverse axis according to the embodiments of the present invention;

FIG. 5 is a cross-sectional view showing the capacitor structure along the line V—V of a longitudinal axis of FIG. 4 according to the embodiments of the invention; and FIG. 6 is a cross-sectional view showing the capacitor structure along the line VI—VI of a transverse axis of FIG. 4 according to the embodiments of the invention.

DETAILED DESCRIPTION OF THE PREFERRED EMBODIMENTS

Figure 1A:
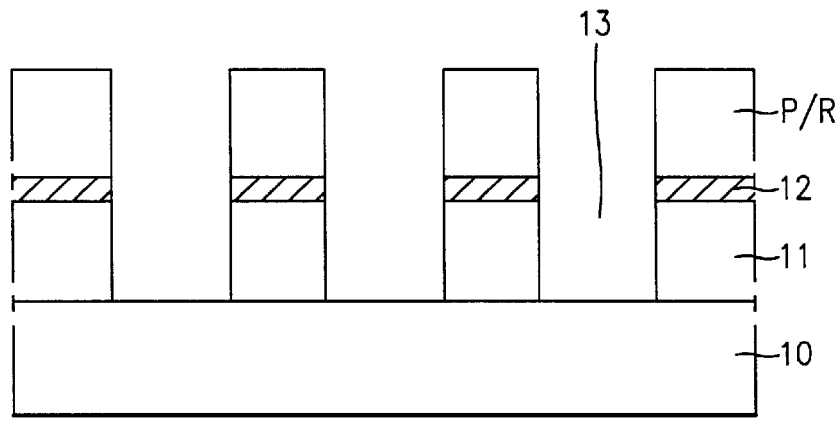
FIGS. 1a through 1d are cross-sectional views showing a conventional method for manufacturing a conventional capacitor of a semiconductor device.
Figure 1B:
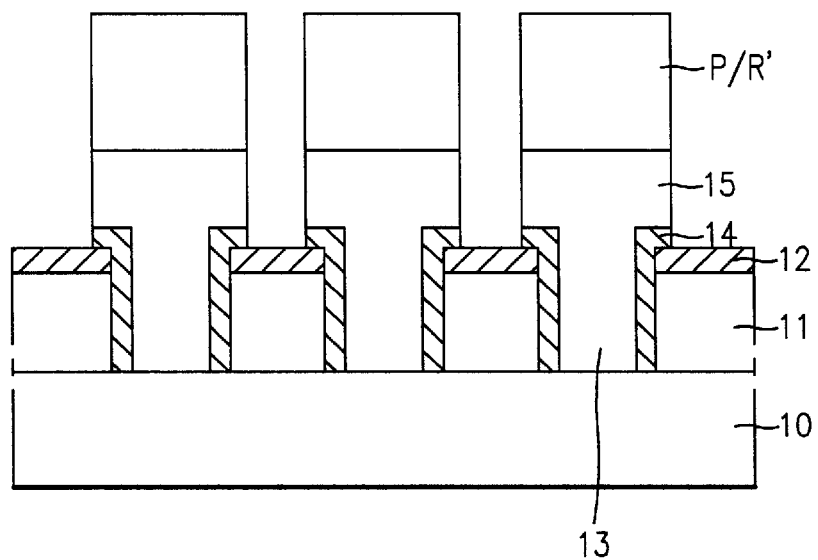
Figure 1C:
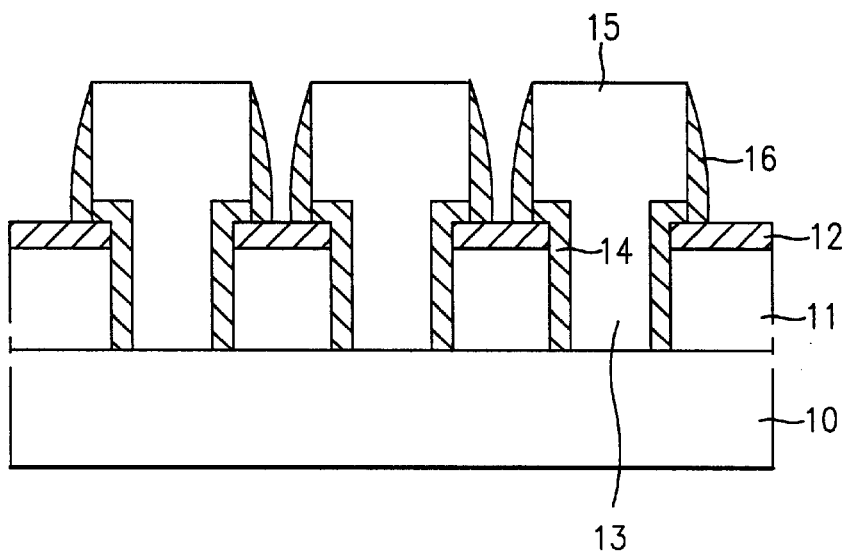
Figure 1D:
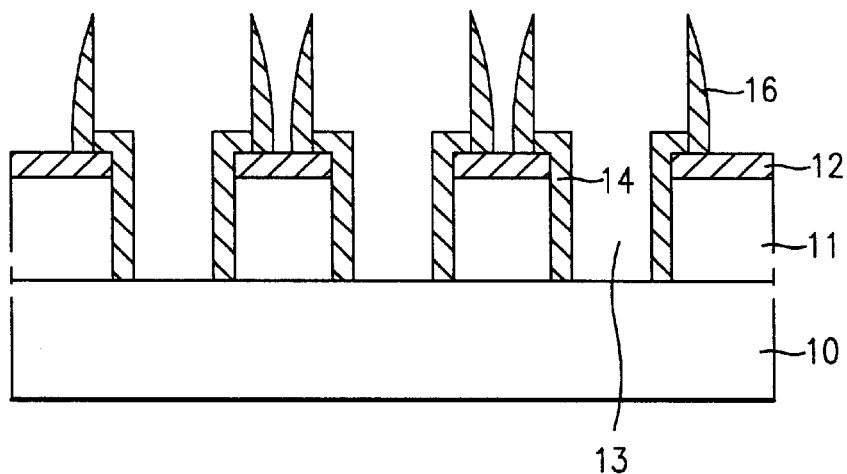
Figure 2A:
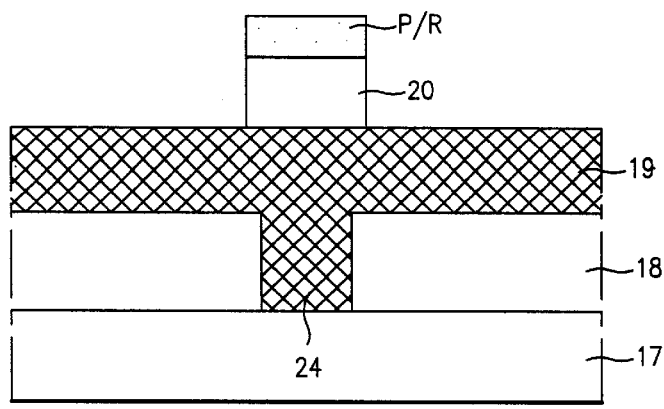
FIGS. 2a through 2f are cross-sectional views showing another conventional method for manufacturing a conventional capacitor of a semiconductor device.
Figure 2B:
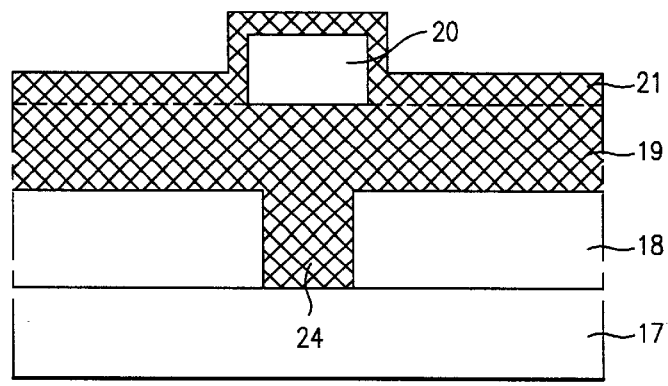
Figure 2C:
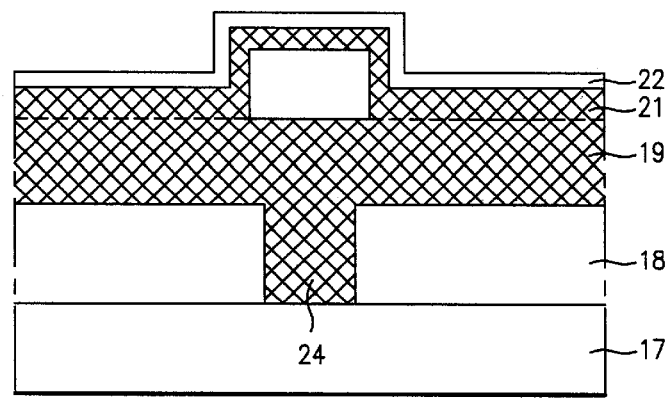
Figure 2D:
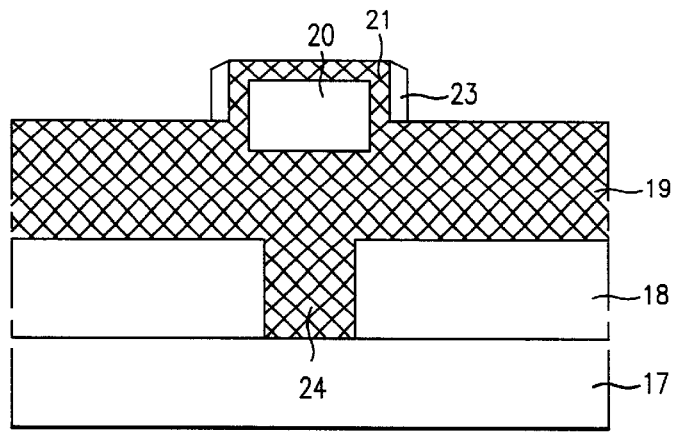
Figure 2E:
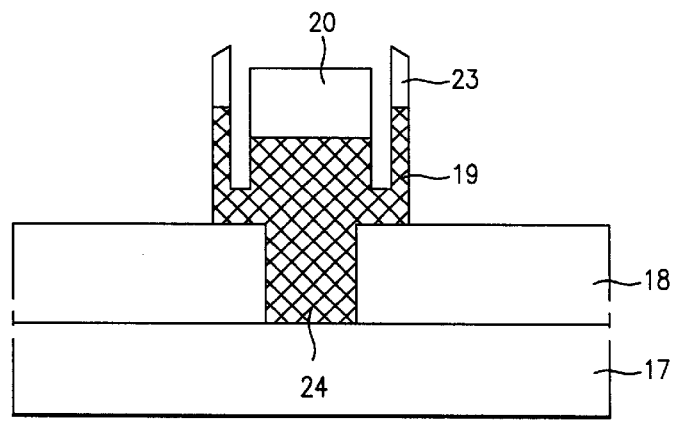
Figure 2F:
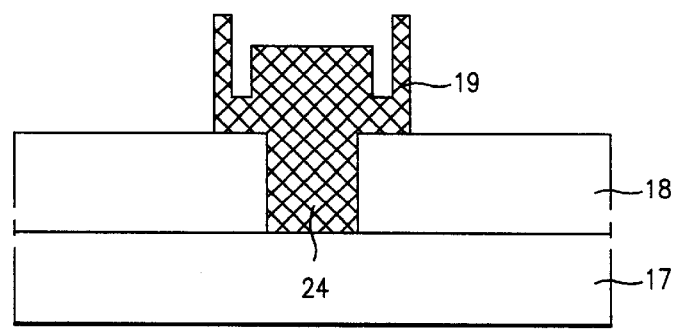

Reference will now be made in detail to the preferred embodiments of the present invention, examples of which are illustrated in the accompanying drawings.

Taking account of various conditions such as, for example, pattern sizes, mask manufacturing techniques, and etching methods used in current semiconductor manufacturing processes, a capacitor for a semiconductor device of the invention is designed to be optimal for obtaining process tolerance, providing sufficient capacitance, planarizing devices, and so forth. The capacitor of the invention is used preferably, e.g., in a DRAM type memory device.

Referring to FIG. 5, the capacitor structure according to the preferred embodiments of the present invention includes a plurality of transistors having word lines and bit lines formed on an active region of a semiconductor substrate 30, a plurality of impurity diffusion regions 30a formed therein to be adjoining to both sides of each transistor, an interlayer dielectric (ILD) 31, a nitride layer 32, first storage node electrodes 35*a* buried in the storage node contact holes 34, and second storage node electrodes 37*a* formed on portions of the bottom layer of the first storage node electrodes 35*a* extending out on sides of the first storage node electrodes 35*a* in a longitudinal axis direction.

The first storage node electrodes 35*a* include a cylindrical layer 35*b* forming wall layers 39*a* and 39*b* (e.g., having an oval shape) projecting upwardly from its bottom layer. The second storage node electrodes 37*a* include a cylindrical layer 37*b* forming wall layers 38*a* and 38*b* projecting upwardly from a portion of the bottom layer of the first storage node electrodes 35*a*.

The wall layer 38*a* has a bottom portion on the extended bottom layer of the first storage node electrodes 35*a*. The wall layer 38*a* has an outside surface, and an inside surface perpendicular to the bottom layer of the first storage node electrodes 35*a*. The other wall layer 38*b* is similar to the wall layer 39*b*, but has a bottom side portion which is in contact with the end of the extended bottom layer of the first storage node electrodes 35*a*. The bottom layer of the first storage node electrodes 35*a* is spaced away from the nitride layer 32 by the thickness of a first insulating layer 33 (shown in FIG. 3*d*) removed in the manufacturing process.

The width of the cylindrical layer 37*b* (i.e., the distance from the wall layer 38*a* to the wall layer 38*b*) is less than the distance between the wall layers 39*a* and 39*b* of the first storage node electrodes 35*a*. The inside surface of each of the wall layers 38*a* and 38*b* is perpendicular to the bottom layer of the first storage node electrodes 35*a*, while the outside surface is similar to an oval silhouette, e.g., having a curved surface.

Referring to FIG. 6, the above capacitor structure along a transverse axis shows the second storage node electrodes 37*a* per storage node hole. This shows two capacitor structures along the transverse axis.

A method for manufacturing a capacitor of a semiconductor device according to the embodiment of the present invention will be described with reference to the accompanying drawings.

As shown in FIG. 3*a*, an interlayer dielectric (ILD) 31 is formed on a semiconductor substrate 30 having impurity diffusion regions 30*a* formed therein, and cell transistors (having word lines and bit lines) formed thereon. Next, a nitride layer 32 is deposited on the interlayer dielectric 31, and an oxide layer is deposited on the nitride layer 32 to form a first insulating layer 33. Then, the first insulating layer 33, the nitride layer 32, and the interlayer dielectric 31 are simultaneously selectively etched, e.g. wet-etched to form storage node contact holes 34.

As shown in FIG. 3*b*, a first polysilicon layer 35 of a thickness of 500–1000 Angstroms is formed on the first insulating layer 33 inclusive of the storage node contact holes 34. The first polysilicon layer 35 is made conductive in nature by means of any conventional method. Then a 2000–6000 Angstrom thick oxide layer is formed on the first polysilicon layer 35 to form a second insulating layer 36. Subsequently, a negative photoresist layer (P/R), which is reverse-tone patterned by using a word line mask, is patterned on the second insulating layer 36.

The negative photoresist layer (P/R) is used to selectively remove the second insulating layer 36. Because an end-point is applied to the first polysilicon layer 35, time-etch is not detected when etching the second the etching process allows etching of the second insulating layer 36 to stop at the point where the first polysilicon layer 35 begins.

In a case when another mask having a shortened pattern size is used, instead of the word line mask, a sufficient process tolerance is obtained. For example, when the current pattern size having a space/line of 0.25 $\mu$m/0.35 $\mu$m and a mask having 0.25 $\mu$m/0.25 $\mu$m pattern sizes of the space/line is used, sufficient process tolerance is obtained.

Figure 3C:
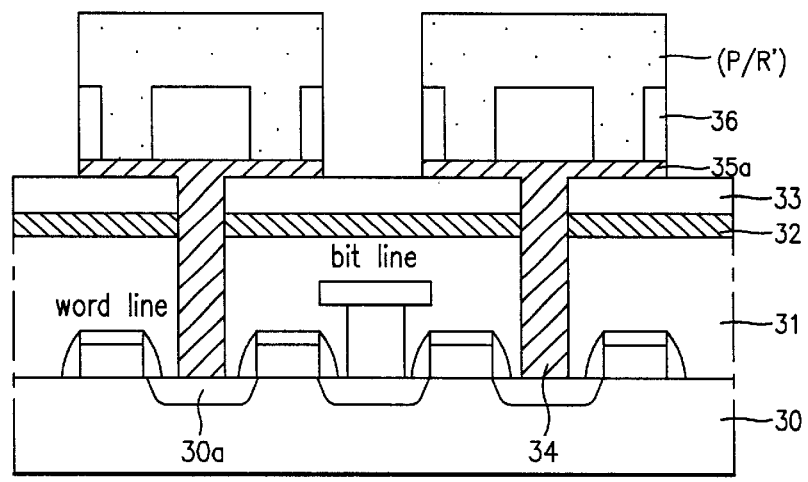

Referring to FIG. 3*c*, the remaining negative photoresist layer is completely removed. Another photoresist layer (P/R') is deposited on the first polysilicon layer 35 inclusive of the second insulating layer 36 pattern, and patterned by using a storage node mask. With the photoresist layer pattern (P/R') serving as a mask, the second insulating layer 36 and the first polysilicon layer 35 are selectively etched, thereby forming first storage node electrodes 35*a*. At this time, capacitors between neighboring cells are spaced away from one another by the process step of patterning the first polysilicon layer 35. Consequently, capacitance can be increased by reducing shrinkage in the longitudinal direction. Shrinkage occurs at the bottom portion of the storage node in the longitudinal direction, and is caused by a photoproximity effect arising due to constructive/destructive intereference of exposure light used with a mask pattern. A reduction in shrinkage allows for a larger storage node to be formed. Because a larger storage node is formed, more cylindrical layers are formed on the storage node. Thus, with an increased number of cylindrical layers, capacitance increases. A large storage node can be formed using, for example, a storage node mask. A phase shift mask (PSM) may be used to reduce the constructive/destructive intereference of light, preventing shrinkage.

Figure 3D:
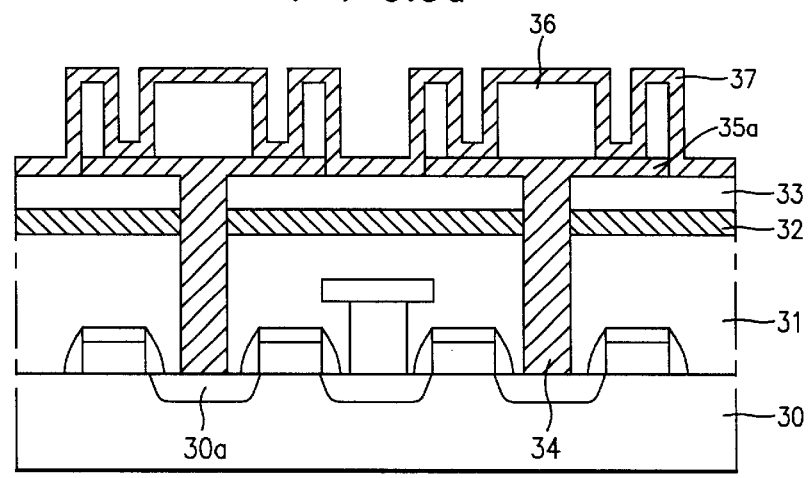

Subsequently, as shown in FIG. 3*d*, a polysilicon layer having a thickness of 500–1000 Angstroms is deposited on the entire surface of the first insulating layer 33 inclusive of the second insulating layer 36 patterned on the storage node electrode 35*a*, thereby forming a second polysilicon layer 37. The second polysilicon layer 37 is made conductive by means of any conventional method.

Figure 3E:
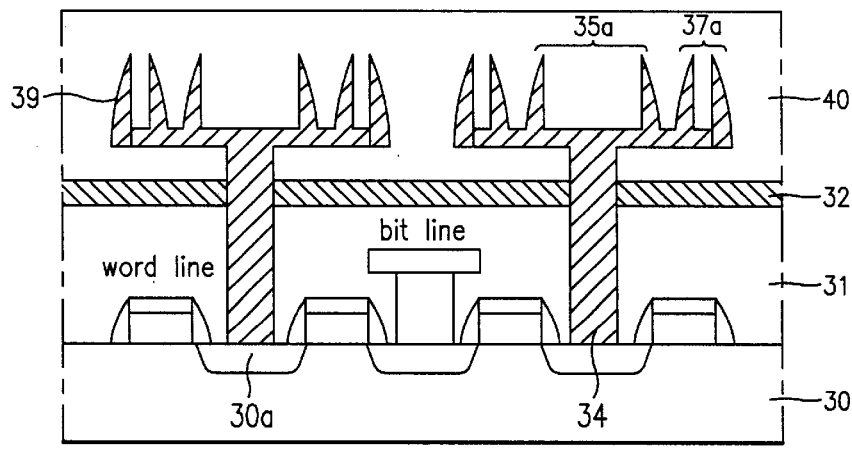

Referring to FIG. 3*e*, the second polysilicon layer 37 is etched anisotropically and then the second insulating layer 36 and the first insulating layer 33 are removed to form a lower electrode of the capacitor, which includes the first storage node electrode 35*a* and the second storage node electrode 37*a*. Subsequently, a dielectric layer 39 is formed on the lower electrode, and an upper electrode 40 is sequentially formed on the top of the dielectric layer 39, thereby completing the capacitor.

A capacitor of a semiconductor device according to the embodiments of the invention includes storage node electrodes each having a cylindrical structure in which three cylinders overlap per storage node in a longitudinal axis direction and two cylinders overlap in the transverse axis direction.

Because the number of cylinders overlapping in the longitudinal axis direction is larger than that in the transverse axis direction, capacity of a capacitor is increased. This is accomplished because the space margin of the longitudinal axis is larger than that of the transverse axis, and the number of overlapping cylinders for the longitudinal axis is larger than that for the transverse axis, thereby increasing the capacitance in the same process.

A capacitor of a semiconductor device according to the embodiments of the invention has the following advantages.

First, since storage node electrodes constituting a capacitor have a cylindrical structure in which at least three cylinders overlap in one direction, capacitance per unit area is maximized taking account of pattern sizes and planarization of the device.

Second, end-point, not etching time, is detected when etching an insulating layer to determine a height of a storage node electrode having a cylindrical structure, thereby maximizing process tolerance in etching a 1.5 cylinder structure.

Finally, when a longitudinal axis direction is defined largely by an align margin of a word line mask to a storage node mask, a conventional word line mask may be used, thereby reducing the production cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A storage node electrode structure for a capacitor of a semiconductor device having impurity regions formed therein, comprising:
   a buried layer disposed in a hole of the semiconductor device, said buried layer being in contact with at least one impurity region;
   a bottom layer formed on said buried layer and extending beyond said buried layer;
   a first cylindrical electrode having first walls upwardly extending from said bottom layer; and
   second cylindrical electrodes having second walls upwardly extending from said bottom layer and disposed on outer sides of said first cylindrical electrode;
   wherein a width of each of said second cylindrical electrodes in a horizontal direction is less than a width of said first cylindrical electrode in the horizontal direction, and
   a width of each of said second cylindrical electrodes in a transverse direction is substantially the same as a width of said first cylindrical electrode.

2. The structure of claim 1, wherein each of said first and second walls includes a first surface formed substantially perpendicularly to said bottom layer and a second surface which is curved.

3. A semiconductor device having a capacitor formed therein, comprising:
   a substrate having impurity regions formed therein;
   an insulating layer disposed on said substrate;
   a buried layer disposed in a storage node area defined by at least said insulating layer, wherein said buried layer is in contact with at least one of said impurity regions;
   a bottom layer formed on said buried layer and extending beyond said buried layer;
   a first cylindrical electrode having first walls upwardly extending from said bottom layer;
   second cylindrical electrodes having second walls upwardly extending from said bottom layer and disposed on outer sides of said first cylindrical electrode;
   a dielectric layer disposed of said first cylindrical electrode and said second cylindrical electrodes; and
   an upper electrode disposed on said dielectric layer;
   wherein a width of each of said second cylindrical electrodes in a horizontal direction is less than a width of said first cylindrical electrode in the horizontal direction, and
   a width of each of said second cylindrical electrodes in a traverse direction is substantially the same as a width of said first cylindrical electrode in the transverse direction.

4. The device of claim 3, further comprising:
   a plurality of transistor structures, each transistor structure disposed on said substrate adjacent to said impurity regions.

5. The device of claim 4, wherein each of said transistor structures includes a word line and a bit line disposed on said substrate.

6. The device of claim 3, further comprising:
   a protective layer formed on said insulating layer.

7. The device of claim 6, wherein said first cylindrical electrode is spaced away from said protective layer by a predetermined distance.

8. The device of claim 3, wherein each of said first and second walls includes a first surface formed substantially perpendicular to said bottom layer and a second surface which is curved.

* * * * *